US006469526B1

(12) United States Patent
Franklin

(10) Patent No.: US 6,469,526 B1
(45) Date of Patent: Oct. 22, 2002

(54) SYSTEM FOR DETECTING CONDUCTIVE CONTAMINANTS AND METHOD OF USE

(75) Inventor: Marshall R. Franklin, Corona, CA (US)

(73) Assignee: Synagro Technologies, Inc., Houston, CA (US)

(*) Notice: Subject to any disclaimer, the term of this patent is extended or adjusted under 35 U.S.C. 154(b) by 0 days.

(21) Appl. No.: 09/547,555

(22) Filed: Apr. 12, 2000

(51) Int. Cl.[7] .......................... G01R 27/08; G01N 15/00
(52) U.S. Cl. ....................................... 324/701; 73/865.5
(58) Field of Search ................................ 324/701, 71.1, 324/71.4, 439, 663, 698; 73/865.5; 75/10.19; 210/603, 608

(56) References Cited

U.S. PATENT DOCUMENTS 5,508,622 A * 4/1996 Gatzlaff et al. ............. 324/701

* cited by examiner

*Primary Examiner*—N. Le
*Assistant Examiner*—J Kerveros

(74) *Attorney, Agent, or Firm*—Locke Liddell & Sapp LLP

(57) ABSTRACT

The present invention provides a system to detect conductive contaminants interspersed within unconsolidated materials. By using the system described herein, voluminous amounts of unconsolidated materials such as soils, waste streams, hay, and similar non-conductive materials may be processed such that conductive contaminants, namely metal objects, may be identified and removed from the processed material. In general, the present invention utilizes the conductive property of these contaminants to alert the system such that the contaminant may be removed. By passing the unconsolidated materials across an arrangement of different contacts placed in close proximity, metal or similar conductive contaminants will complete an electrical circuit that signals a sensor within the circuit and initiates a partial shut down procedure. Though this sensor is preferably at least one programmable voltage sensor, the sensor may comprise a current transformer or light incorporated into the electrical circuit that detects each conductive contaminant. A light sensor that may trigger at least one relay to halt the processing of material as described herein may detect this emission. This system and its method of use may be adapted to detect conductive contaminants in voluminous, unconsolidated materials in a variety of applications.

24 Claims, 9 Drawing Sheets

SYSTEM FOR DETECTING CONDUCTIVE CONTAMINANTS AND METHOD OF USE

FIELD OF THE INVENTION

This invention relates to a system for detecting conductive contaminants interspersed within unconsolidated, primarily non-conductive materials. The conductive properties of the contaminants complete a detectable electrical circuit. In addition, a method of using this system allows for the removal of potentially dangerous or harmful conductive contaminants from the unconsolidated materials.

BACKGROUND OF THE INVENTION

Waste recycling companies and waste management companies have searched for new technology to detect and remove harmful conductive contaminants interspersed within nonconductive, unconsolidated materials. For example, nails, aluminum cans, and metal refuse are often discarded in composts, soils, or waste materials. Likewise, hypodermic needles, razors, or similar potentially hazardous contaminants may also be discarded within these unconsolidated materials. As such, it is preferably to remove these contaminants before the waste materials are recycled to provide source materials for potting soils, fertilizers, and other similar useful products.

Unfortunately, and despite the waste-recycling companies' best intentions, these now-useful materials occasionally include portions or remnants of these harmful and dangerous conductive contaminants. Due to the volume of unconsolidated materials that must be scrutinized for these conductive contaminants, it has been admittedly difficult to screen or search for these conductive contaminants. Countless tons of unconsolidated materials have not been recycled out of fear that conductive contaminants remaining therein could harm or otherwise injure those attempting to use these recycled materials.

In fact, recycled materials that contain conductive contaminants have harmed innocent users. For example, purchasers of these recycled materials have risked the danger of being harmed by nails, cans, or similar items that were interspersed within these unconsolidated materials. In an extremely dangerous situation, it is conceivable that users of these recycled products could encounter a discarded hypodermic needle that could be contaminated with an infectious disease.

Waste recycling companies have devised or used various methods of detecting these conductive contaminants with marginal success. For example, it is possible to visually inspect small amounts of unconsolidated material for these kinds of conductive contaminants. Due to the nature of the unconsolidated materials and the size of the conductive contaminant, however, this type of search is literally "looking for a needle in a hay stack." Due to the excessive volume of materials that must be screened, a visual inspection is impractical and inefficient.

In the alternative, the prior art described sifting techniques that would capture larger objects while allowing granules such as sand to pass through a sifter or a series of sifters. This method is particularly inappropriate when the unconsolidated material comprises branches, twigs, or similar structured materials that cannot pass through the relatively small holes of the sifters. Moreover, a strategically placed needle or similar conductive contaminant could theoretically pass through the sifting screens without being detected or removed.

Therefore, a serious need exists to provide a system and a method of using this system that can manage the voluminous amounts of unconsolidated materials that must be screened for these conductive contaminants such as nails and needles.

SUMMARY OF THE INVENTION

The present invention provides a system to detect the conductive contaminants interspersed within unconsolidated materials. By using the system described herein, voluminous amounts of unconsolidated materials such as soils, waste streams, hay, and similar non-conductive materials may be processed such that conductive contaminants, namely metal objects, may be identified and removed from the processed material.

Though many variations of the present invention will be evident to those skilled in the art, the present invention utilizes the conductive property of these contaminants to alert the system such that the contaminant may be removed. By passing the unconsolidated waste materials across an arrangement of alternatingly charged contacts placed in close proximity, metal or similarly conductive contaminants will complete an electrical circuit that may be detected by a sensor that alerts or otherwise indicates the presence of the conductive contaminant and initiates a shut down procedure.

In an alternative embodiment of the invention, this alerting system comprises a neon light incorporated into the electrical circuit that emits light when the circuit is completed by the conductive contaminant. When a light detector detects the emission of light, it triggers a relay to halt the processing of material as described herein. This system and its method of use may be adapted to detect conductive contaminants in voluminous, unconsolidated materials for a variety of applications.

The foregoing has outlined rather broadly the features of the system and method of the present invention so that the detailed description of the invention that follows may be better understood. Additional features and advantages of the invention will be described hereinafter which form the subject of the claims of the invention. Those skilled in the art should appreciate that the conception and the specific embodiments disclosed may be readily used as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The accompanying drawings, which are incorporated in and form part of the specification, illustrate the embodiments of the present invention, and, together with the description, serve to explain the principles of the invention. In the drawings.

It is to be noted that the drawings illustrate only typical embodiments of the invention and are therefore not to be considered limiting of its scope, for the invention will admit to other equally effective embodiments.

DETAILED DESCRIPTION OF PREFERRED EMBODIMENT

Figure 1:
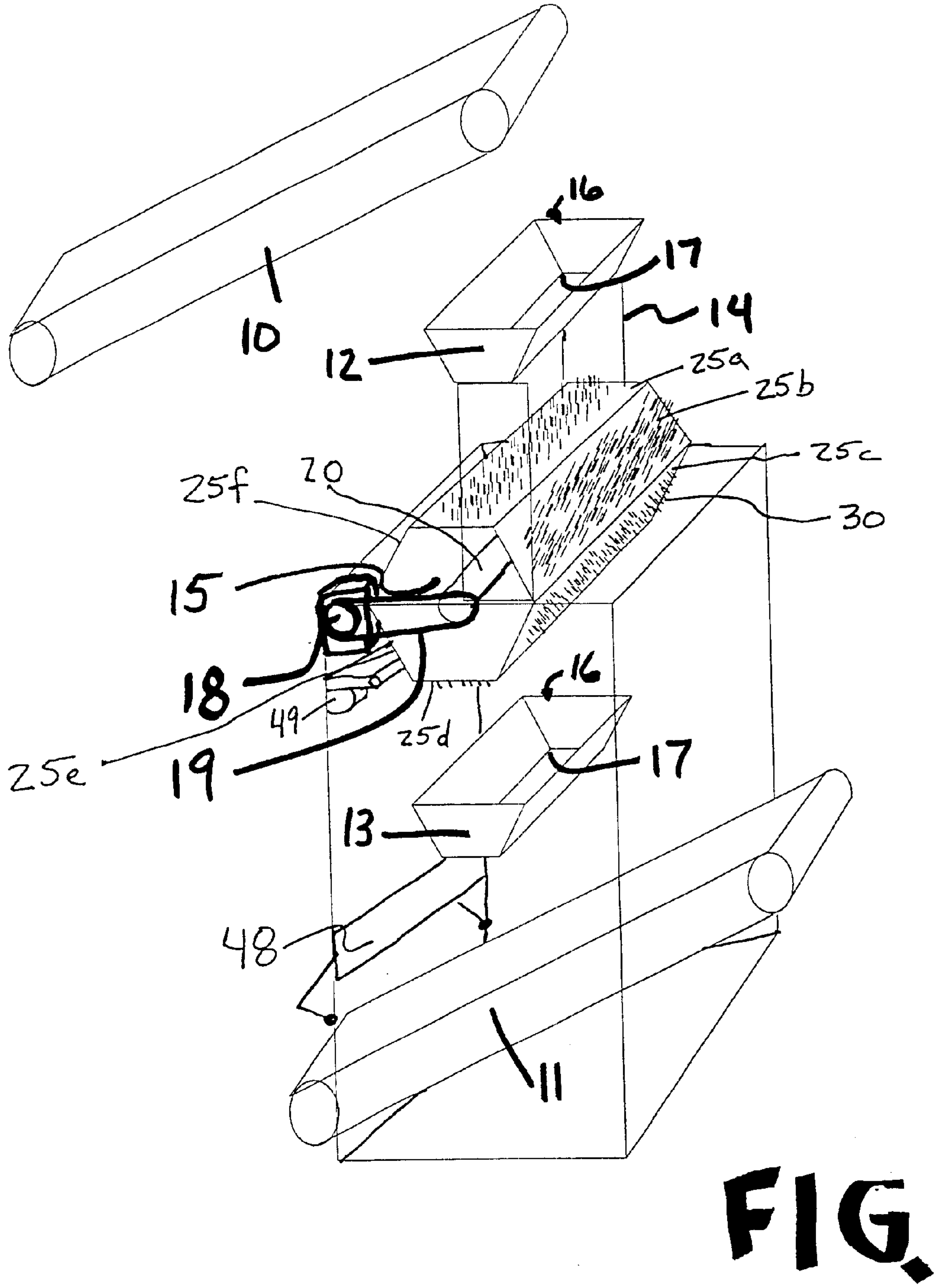
FIG. 1 an exploded perspective view of a preferred embodiment of the invention.

Though many methods of conveying unconsolidated waste material will be evident to those skilled in the art, the preferred embodiment of the invention as shown in FIG. 1 comprises a plurality of conveyors 10 and 11, preferably about 24 inches (61 cm) wide, as described herein as in-feed conveyor 10 and discharge conveyor 11. Unconsolidated material is transported up the in-feed conveyor 10 such that the unconsolidated material is deposited into infeed hopper 12. With proper positioning of infeed hopper 12, unconsolidated material is ultimately disposed upon detecting wheel 15 for maximum efficiency in detecting any conductive contaminants contained therein. As detection wheel 15 rotates, the unconsolidated material now verified to be devoid of conductive contaminants, is collected in hopper 13 and ultimately falls upon discharge conveyor 11 to be transported or packaged for future use.

Either hopper 12 or 13 typically comprises a top opening 16 and bottom opening 17, wherein the bottom opening 17 is slightly smaller in area than top opening 16. The positioning of hopper 12 may be adjusted, preferably on metal rails, to strategically deposit or channel unconsolidated material on detection wheel 15 such that detection wheel 15 may handle the flow of unconsolidated material quickly and efficiently. In the preferred embodiment, the bottom opening 17 of the hopper comprises approximately 20 inches (50.8 cm)×42 inches (106.7 cm) and the detection wheel 15 is about 36 inches (91.4 cm) along its axis.

Hopper 12 is preferably movably attached to frame assembly 14 such that hopper 12 is adjustably disposed to deposit unconsolidated material, possibly comprising conductive contaminants, on detection wheel 15 in an optimum location for the detection of the conductive contaminants. Although those skilled in the art will recognize variations to this positioning, the preferred embodiment comprises at least 2 inches (5.1 cm) of clearance between the bottom opening 17 of hopper 12 and the closest point of rotation of detection wheel 15 during a complete rotation cycle.

In the preferred embodiment, the detection wheel 15 is moved or controlled by a variable speed gearbox and motor 18 capable of operating from about 7 rotations per minute ("RPM") to about 75 RPM, more preferably 20 RPM to 25 RPM. The motor is preferably a three-phase, one-horsepower electric motor operating at 220 volts. This gear box and motor 18 is rotatably attached via a belt, chain, or similar drive 19 to a rotatable shaft 20 that extends through the axis of detection wheel 15.

Figure 2:
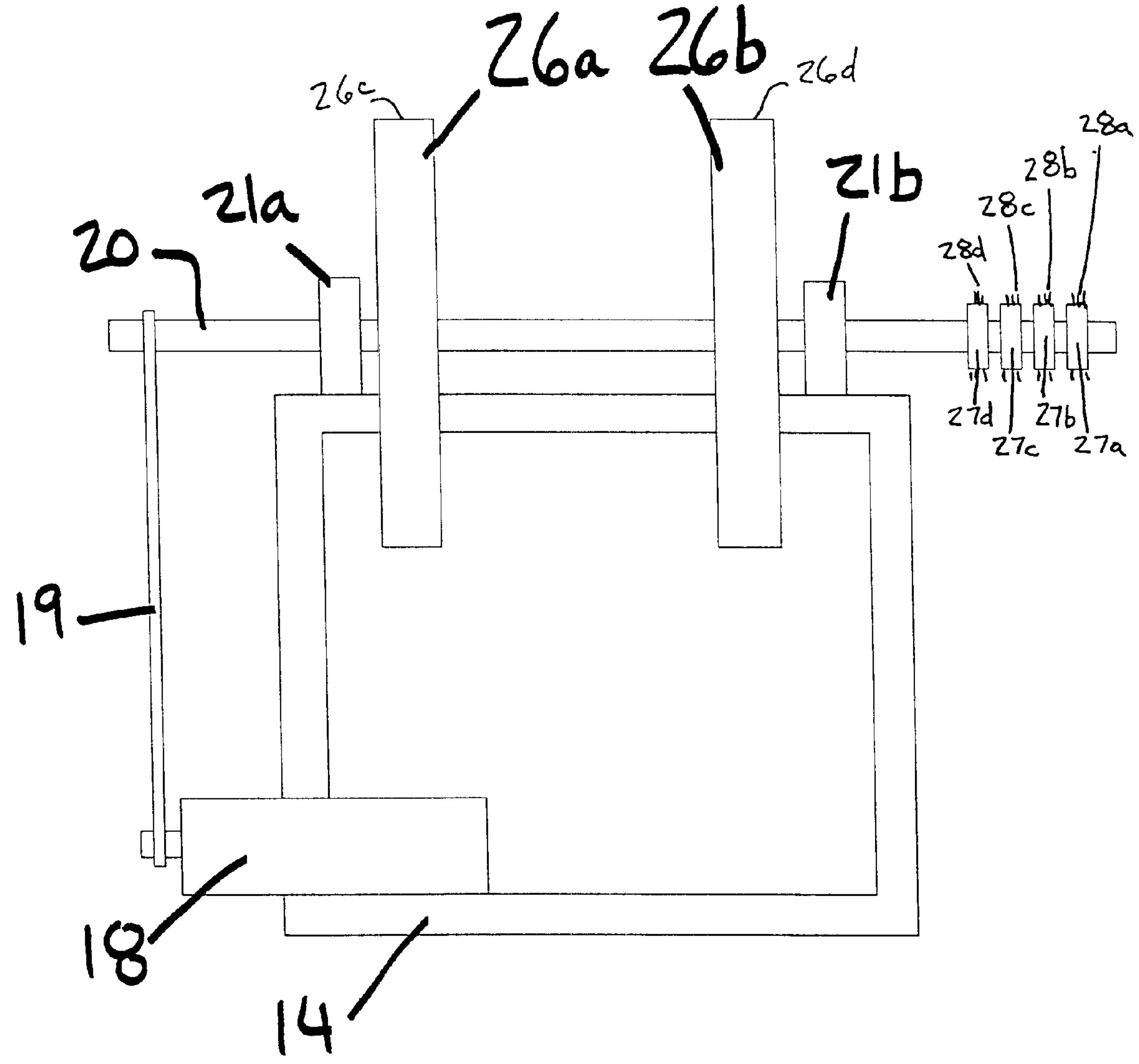
FIG. 2 is a close schematic front view of the internal assembly of an embodiment of the invention.

As shown in FIG. 2, shaft 20 preferably comprises a 3 7/16 inches (8.73 cm) tube shaft resting upon a plurality of 3 7/16 inches (8.73 cm) pillow block bearings 21*a* and 21*b* disposed about either end of shaft 20 to provide a requisite load bearing member capable of sustaining the detection wheel 15 while allowing for the necessary wiring discussed below.

In addition, at least one support disk, shown as a pair of support disks 26*a* and 26*b* in FIG. 2, may be fixedly attached to the shaft 20. These disks 26*a* and 26*b* preferably have a diameter of about 36 inches (91.4 cm) and have an outer rim 26*c* and 26*d*, respectively, to provide the requisite support and attachment for sections 25*a*, 25*b*, 25*c*, 25*d*, 25*e*, and 25*f* (referred to as 25*a*–25*f* herein) of the detection wheel 15 shown in FIG. 1. Though many configurations will be evident to those skilled in the art, each section 25*a*–25*f* of detection wheel 15 may be fixedly attached to the outside of each disk 26*a* and 26*b* such that each section 25*a*–25*f* is disposed in a hexagonal configuration to form the detection wheel 15. The hexagonal prism configuration of sections 25*a*–25*f* forms the exterior surface of detection wheel 15 that is but one embodiment of the detection wheel 15. Those skilled in the art will recognize that detection wheel 15 may be formed of any plurality of surfaces or even one continuous cylindrical surface such that detection wheel 15 would resemble a cylinder. Accordingly, any number of sections 25 could be attached to one or more support disks 26*a* and 26*b* to form detection wheel 15.

Preferably six sections 25*a*–25*f* are arranged to form a hexagonal prism shaped detection wheel 15, as shown in FIG. 1, made of a variety of non-conductive materials. The revolving hexagon detection wheel 15 is controlled by variable speed motor and gear box 18 attached thereto to enable the user to adjust the rotational speed according to the nature and density of the materials being processed. The operation of the speed motor and gearbox 18 may be controlled by a simple on/off switch, lengthy cable apparatus, or remote control, all with appropriate emergency shut off devices.

As shown in FIG. 1, a plurality of contacts 30 are arranged to protrude through an exterior surface of each section 25*a*–25*f*. Though the arrangement will be discussed in more detail herein, no more than about ¾ inches (1.9 cm) may exist between each first contact and a second contact. In the preferred embodiment, each section 25*a*–25*f* is about 12 inches (30.5 cm) wide, about 36 inches (91.4 cm) long, and about one inch (2.54 cm) thick.

Figure 3A:
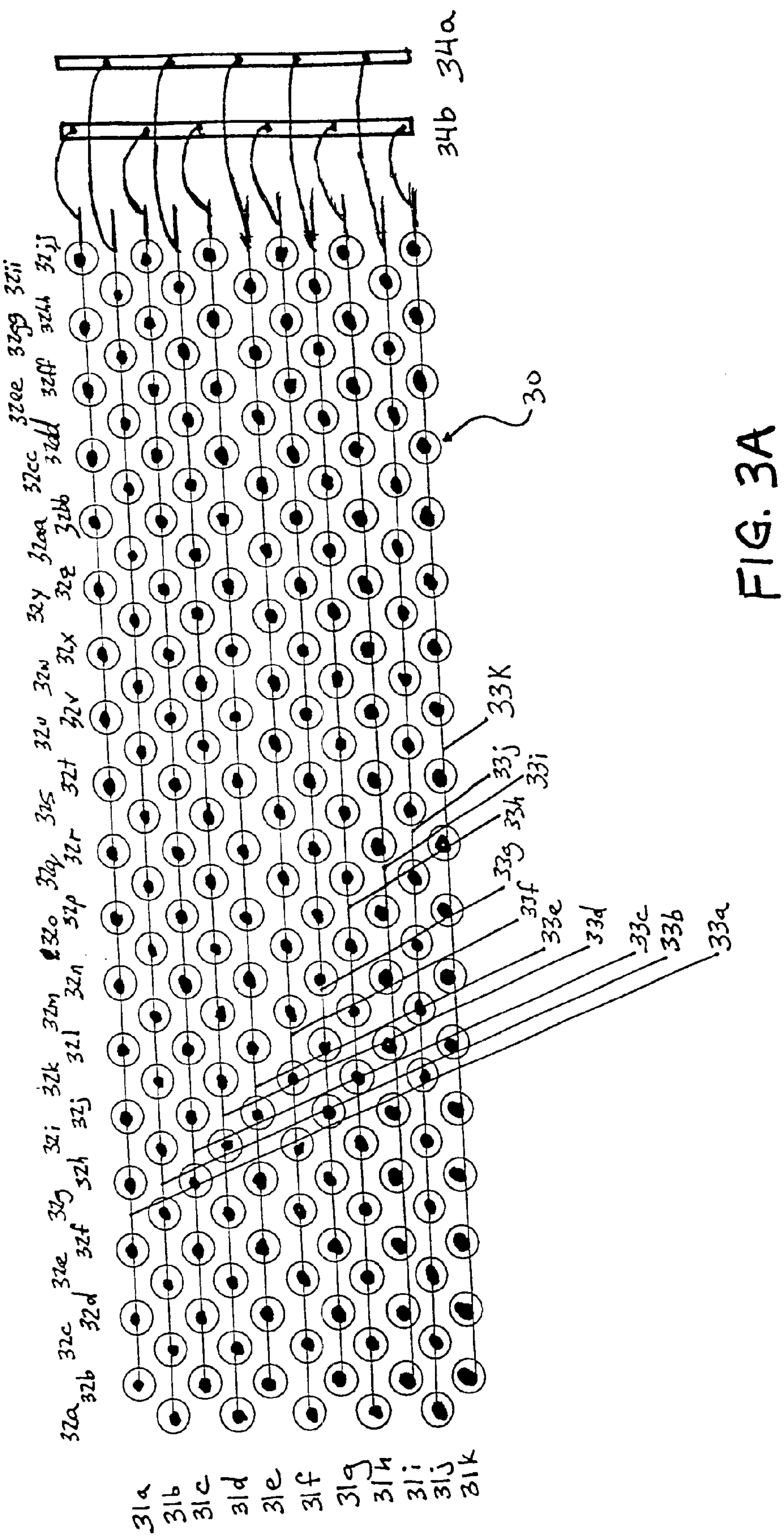
FIG. 3A is a schematic bottom view of the electrical connections of an embodiment of the invention.

Referring now to FIG. 3A, there is shown a schematic bottom view of the electrical connections of a preferred embodiment of the invention. More specifically, FIG. 3A shows a schematic representation of the contacts and bus bar relationships for representative section 25*a*. Those skilled in the art will recognize that significant variations of the contact positioning and electrical wiring as disclosed herein may be implemented. Representative section 25*a* of detection wheel 15 comprises staggered rows of contacts 31*a*, 31*b*, 31*c*, 31*d*, 31*e*, 31*f*, 31*g*, 31*h*, 31*i*, 31*j*, and 31*k* (referred to as 31*a*–31*k* herein) such that alternating rows of contacts 31*a*–31*k* bear a positive, defined as first contacts, and negative charge, defined as second contacts, respectively. By arranging these contacts 31*a*–31*k* in staggered rows, conductive contaminants cannot be positioned such that they will not complete a circuit and signal the sensor system discussed herein. In the preferred embodiment, each section 25*a*–25*f* comprises 11 rows of contacts 31*a*–31*k* and 36 columns of contacts 32*a*–32*jj* alternating between first contacts and second contacts, respectively. Moreover, each contact 30 is about 3 inches (7.62 cm) in length and made of a conductive material such as at least one metal that may convey a completed circuit in the presence of a conductive contaminant at the contacts 30 protruding through sections 25*a*–25*f*. Those skilled in the art will recognize the importance of selecting a conductive substance that is durable and can withstand the constant interaction and vibrations associated with the operation of wheel 15 with consolidated materials during normal operation. Those skilled in the art will also realize that the arrangement of wiring may reverse the charge or voltage available at the first contacts to be positive and the charge available at the second contacts to be negative.

The invention as described and claimed herein is intended to embody both directions of current. In other words, the contacts as defined as first contacts and second contacts, regardless of the electrical connections thereto, may be rearranged in any manner as long as conductive contaminants will fall within about ¼ inches (0.64 cm) to a first contact and within about ¼ inches (0.64 cm) to a second contact.

Each row of contacts 31*a*–31*k* is connected by eleven longitudinal bus bars 33*a*–33*k* disposed along the length of each section 25*a*–25*f*. Two latitudinal bus bars 34*a* and 34*b* are disposed at each end of each section 25*a*–25*f*. Bus bar 34*a* connects alternating longitudinal bus bars 32*b*, 32*d*, 32*f*, 32*h*, and 32*j*. Bus bar 34*b* connects alternating longitudinal bars 32*a*, 32*c*, 32*e*, 32*g*, 32*i*, and 32*k*.

Each of the sections 25*b*–25*f* are similarly connected such that the contacts 30 are arranged in the staggered positioning as shown in FIG. 3A and are electrically connected via the longitudinal bus bar and latitudinal bus bar arrangement depicted in FIG. 3A. Of particular note, section 25*d* is wired exactly the same as section 25*a* depicted in FIG. 3A.

Figure 3B:
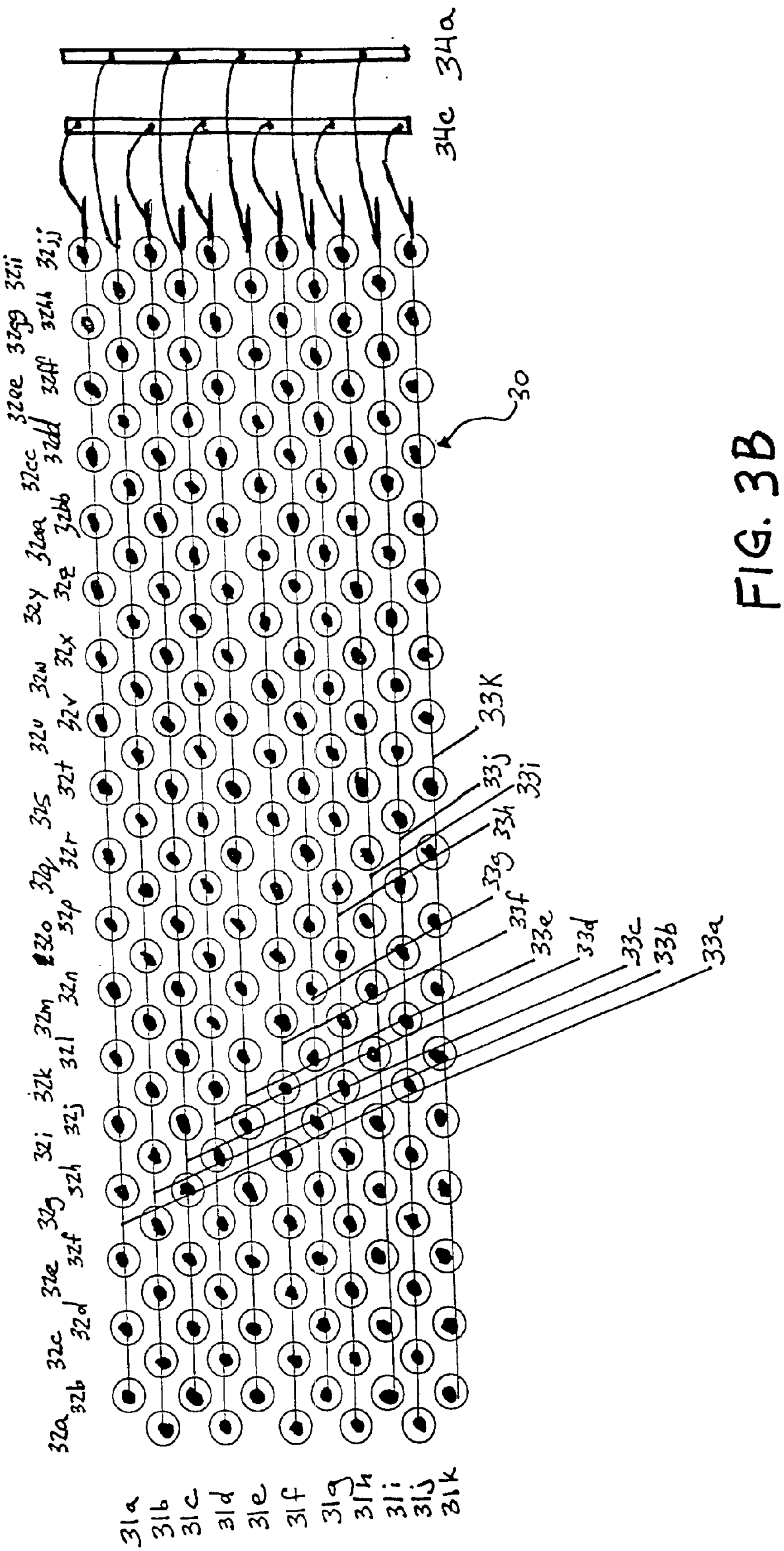
FIG. 3B is a schematic bottom view of the electrical connections of an embodiment of the invention.
Figure 3C:
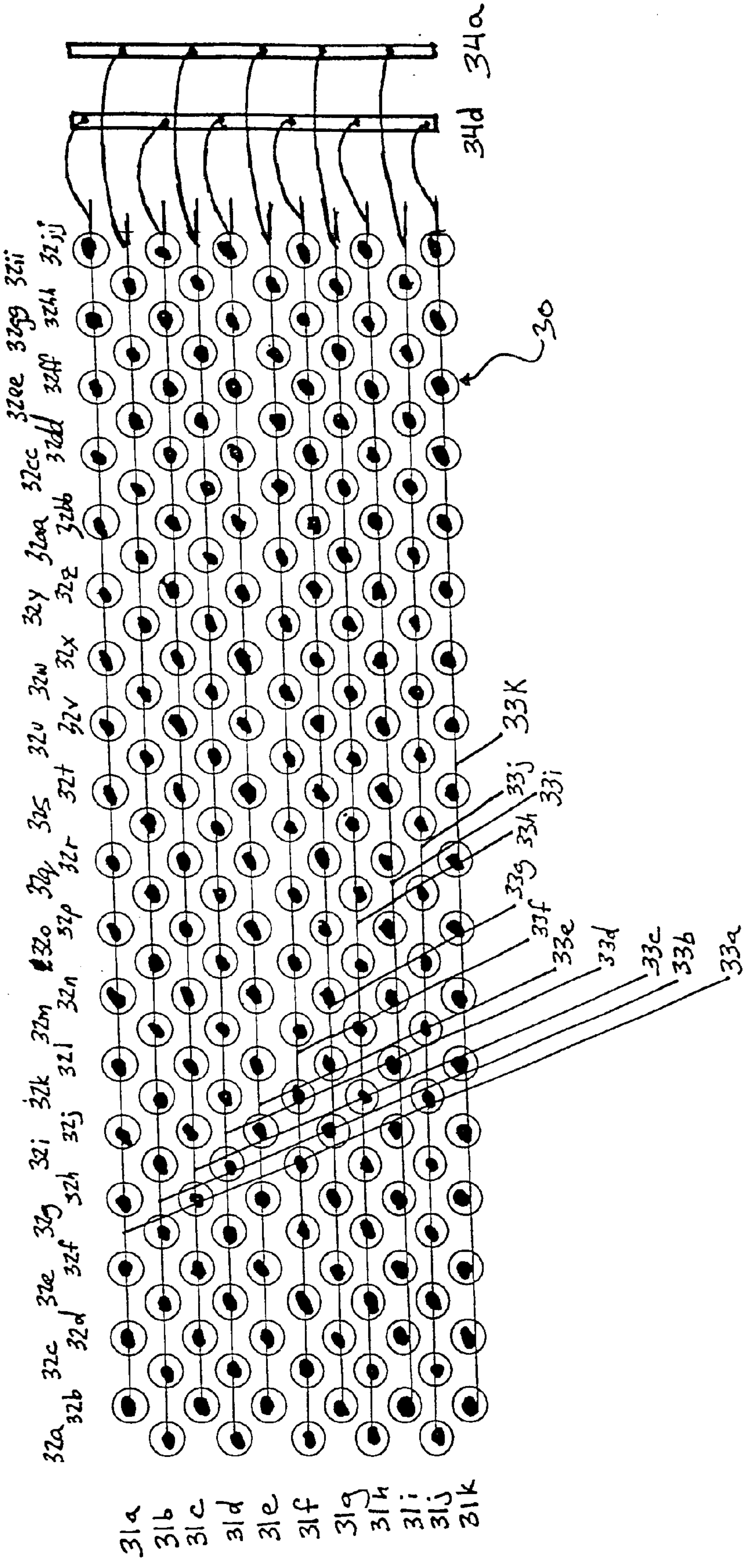
FIG. 3C is a schematic bottom view of the electrical connections of an embodiment of the invention.

Referring to FIG. 3B, sections 25*b* and 25*e* are analogously connected such that the longitudinal bus bars connected to bus bar 34*a* remain the same as depicted in FIG. 3A, however, longitudinal bus bars 31*a*, 31*c*, 31*e*, 31*g*, 31*i*, and 31*k* are connected to bus bar 34C. Analogously, sections 25*c* and 25*f* are connected as depicted in FIG. 3C. As with FIG. 3*c*, bus bar 34 connects to the same longitudinal bus bars. Bus bar 34*d*, however, connects to longitudinal bus bars 31*a*, 31*c*, 31*e*, 31*g*, 31*i*, and 31*k*.

Moreover, in the preferred embodiment, opposing sections 25*a* and 25*d*, are electrically connected to one another via electric brushes 28*a*–28*d* that are rotatably disposed about a plurality of conduction disks 27*a*–28*d* affixed to shaft 20 as shown in FIG. 2. In this arrangement, bus bars 34*a*–34*d* remain in constant and isolated electric communication with conduction disks 27*a*–27*d*, respectively, via brushes 28*a*–28*d*. Three conduction disks 27*b*–27*d* provide positive electrical charge to opposing sections 25*a* and 25*d*, 25*b* and 25*e*, and 25*c* and 25*f*, respectively, and provide positive electric charge to all six sections 25*a*–25*f* of detection wheel 15 in aggregate. Additionally, bus bar 34*a* remains in constant and isolated electrical communication with conductive ring 27*a* via rotatably disposed brushes 28*a* in the same fashion as the conduction disks 27*b*–27*d*. In this configuration, each of the three conductive rings 27*b*–27*d* and the conductive ring 27*a* are attached to rotatable shaft 20 such that the conductive ring 27*a* is insulated from the three conductive rings 27*b*–27*d*. In a preferred embodiment, 2,4000 volts at 10 amps is provided at each positive conductive rings 27*b*–27*d* as explained below.

Figure 4:
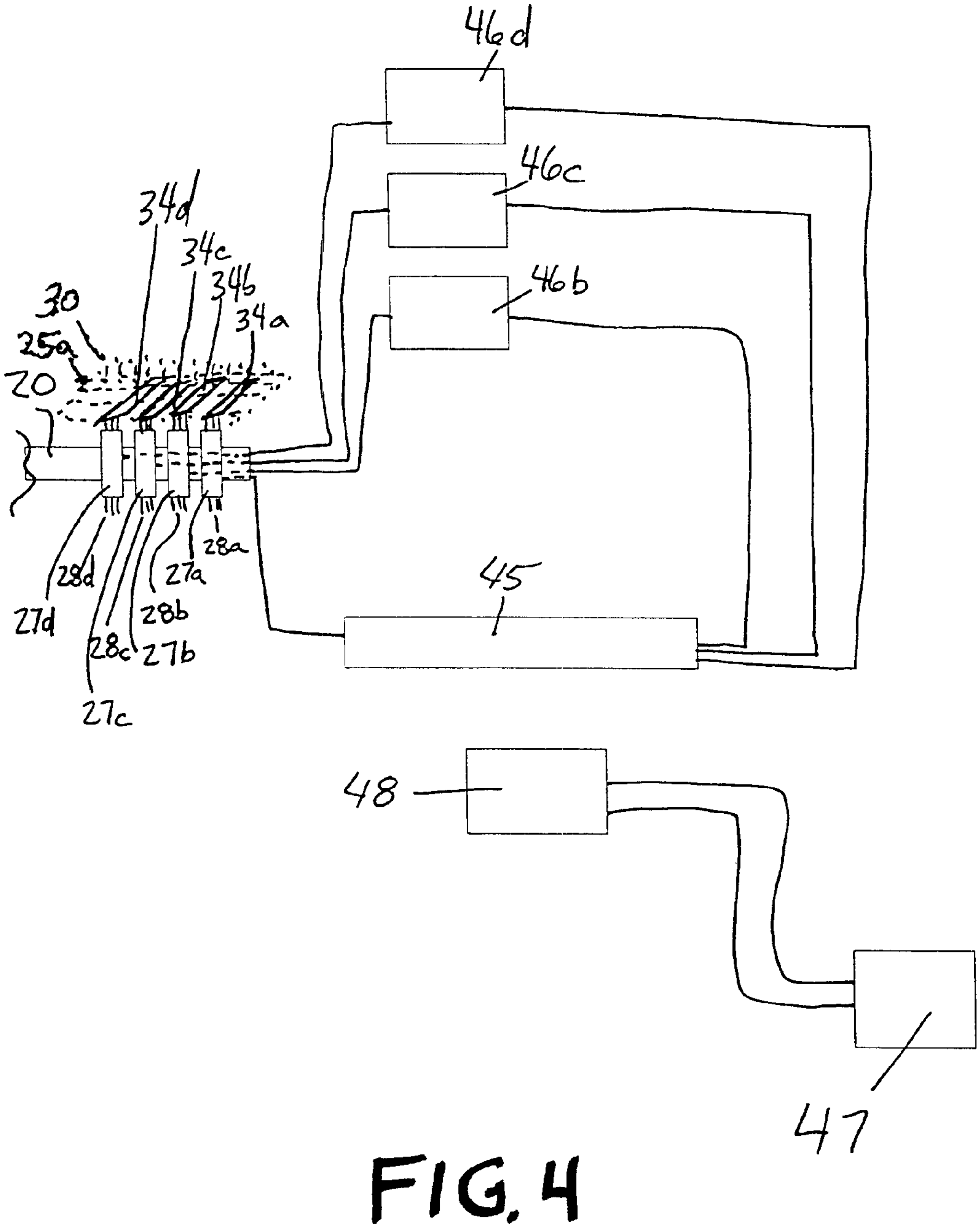
FIG. 4 block diagram of an alternative embodiment of the detection circuit of the invention.

Each conduction disk 27*a*–27*d* may be electrically connected as depicted by the block diagram in FIG. 4. As shown, each conductive ring 27*a*–27*d* is electrically connected to an emission source or current sensing device, preferably a current transformer, most preferably an about 25 amp. current transformer 45. Various emission sources that project emissions in the infrared, ultraviolet, and normal light spectrums are within the scope of this emission provided that each emission source chosen can withstand the surge of about 4,000 volts presented during a completed circuit. Also emissions sources ranging from sound emitters to emitters of electric signals or pulses could be detectable and could also be used. Conduction disks 27*b*–27*d* are separately connected to three discrete transformers 46*b*–46*d* via wiring or other means known to those skilled in the art. Each transformer 46*b*–46*d* is in turn connected to the opposite pole of the emission source or current sensing device.

Upon completion of the circuit by a conductive contaminant at the contacts 30 as explained below, a discharge will course through conductive ring 27*a* via wiring in shaft 20 to current transformer, most preferably an about 25 amp. current transformer 45 electrically connected to negative conductive ring 27*a*. Current transformers 45 are customarily operated at 10 amps so the voltage of the circuit does not present a problem. As explained, current transformer 45 is electrically connected to each transformer 46*b*–46*d*. Transformers 46*b*–46*d* are preferably Ray-O-Vac™ transformers controlled by Veriack™ voltage reducers. Preferably, transformers 46*b*–46*d* are used such that each transformer 46*b*–46*d* is electrically connected to one of the positive conductive rings 27*b*–27*d* via the requisite wiring disposed within the shaft 20. When the circuit is completed by an electrically conductive contaminant, as explained below, current transformer 45 may control or suspend power to discharge conveyor 11 and in-feed conveyor 10.

Figure 5:
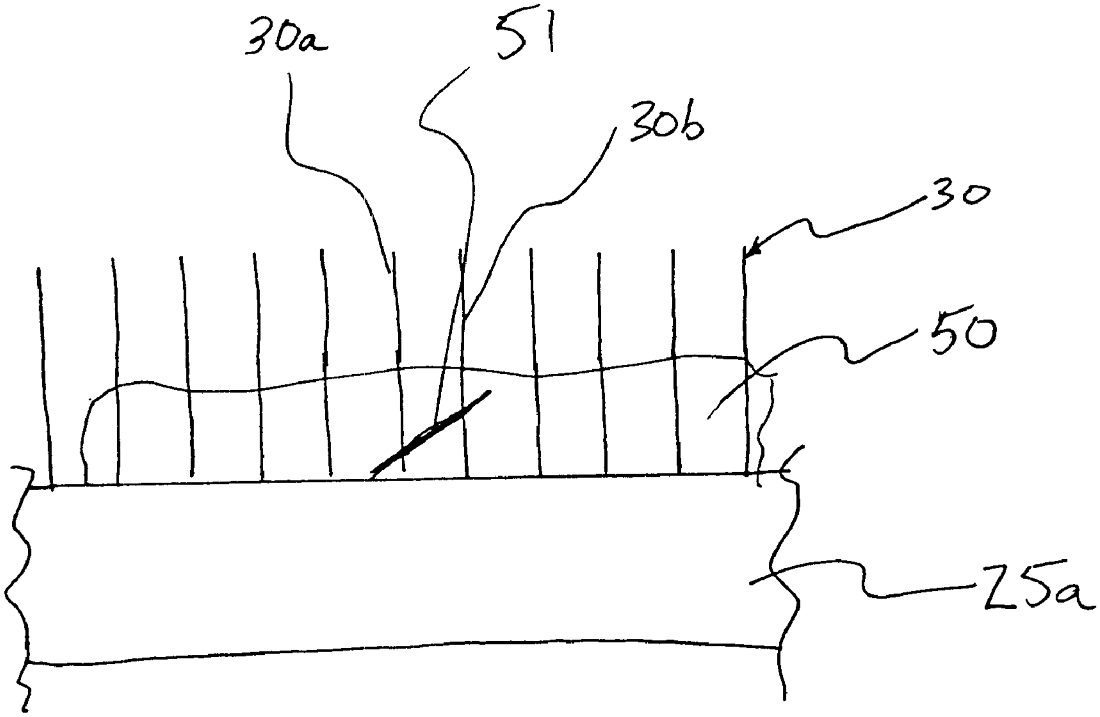
FIG. 5 is a side view showing a close up of a section comprising a conductive contaminant.

As shown in FIG. 5, the preferred embodiment comprises conductive contacts 30 that extend at least about 2 inches (5.1 cm) from the surface sections 25*a*–25*f* of detection wheel 15. In this configuration, unconsolidated material 50 drops upon the exterior surface of detection section 25*a*, for example. The in-feed conveyor 10 controls the feed of unconsolidated material 50 such that no more than about ½ inch (1.27 cm) of unconsolidated material 50 collects upon the contacts 30. This configuration insures that unconsolidated material 50 that may comprise wood, twigs, or other semi-rigid, structured contents are not upwardly disposed such that a conductive contaminant 51 could be positioned beyond the top of contacts 30.

The conductive contaminant 51 strikes a first contact, 30*a* for example, from rows 32*b*, 32*d*, 32*f*, 32*h*, or 32*j*, and second contact, 30*b* for example, from rows 32*a*, 32*c*, 32*e*, 32*g*, 32*i*, or 32*k*, to create the circuit. Due to the 2,400 volts available at each contact 30, a physical strike is not necessary. Proximity of the contaminant 51 within about ¼ inch (0.64 cm) of the contact 30 is all that is needed for the circuit to form. The completion of the circuit causes current transformers 45 to flash. When current transformers 45 activate power shut off relay 47, as shown in FIG. 4, conveyors 10 and 11 may stop. Once conveyors 10 and 11 shut down, detection wheel 15 continues to rotate, expelling the conductive contaminant, along with the unconsolidated material, onto discharge conveyor 11.

This breaks the completed circuit and, after a period necessary for wheel 15 to expel all material comprising the aforementioned outgoing conveyor 11, laden with unconsolidated material that contains some conductive contaminant, is wiped by a delayed wiper 48 shown in FIG. 1 that disposes of the unconsolidated material containing the conductive contaminant. Once the discharge conveyor 11 has been wiped, the in-feed conveyor 10 and discharge conveyor 11 are reactivated, either automatically or by using a manual reset button (not shown). The material wiped or manually removed that may comprise a conductive contaminant may be safely disposed. Moreover, it is envisioned that discharge conveyor 11 could be rotated and the materials could be ushered to a second receptacle (not shown).

Of note, the voltage of the system can be adjusted to change the charge available at contacts 30. Depending on the moisture level of the unconsolidated material, the amount of voltage may need to be reduced in order to prevent false readings due to the conductive nature of the moisture content in the unconsolidated material. The metal detection system is adjustable in several ways.

First, the rate of material may be controlled by the speed of the conveyors 10 and 11. The accumulation of unconsolidated materials on the sections 25*a*–25*f* should only be about ½ inches (1.27 cm) in height in comparison to the 2 inches (5.1 cm) of exposed contacts 30. This arrangement protects against a conductive contaminant from being unnoticed because it was above the top of the contacts 30. Increasing the speed of conveyor belt 10 will pour more consolidated material into hopper 12. Second, hopper 12 may be positioned such that the unconsolidated material being filtered through hopper 12 is deposited upon the detection wheel 15 at an optimum position. Third, the voltage via the transformers 46*b*–46*d* may be adjusted to provide for a voltage setting that will reduce the false detections when unconsolidated material comprises a moisture content that would otherwise create false readings by short circuiting the system. In this situation, voltage is reduced to no less than about 1,000 volts. As the voltage is reduced, however, the sensitivity of the detectors 48 or current transformers 45 must be adjusted to recognize a more faint signals when the circuit is completed by a conductive contaminant. Fourth, the rotation speed of the detection wheel 15 may be adjusted to optimize the load conditions of the unconsolidated material being detected.

In another embodiment of the present invention, an air manifold 49, as shown in FIG. 1, can be disposed such that it may dislodge unconsolidated material intertwined within the contacts 30 when detection wheel 15 rotates that section 25*a*–25*f* to an unloading position. In addition, some conductive contaminants may become "welded" to opposing contacts 30*a* and 30*b*, for example, as a result of the current passing through the circuit. Air manifold 49 is capable of producing a dislodging air gust capable of freeing the conductive contaminant from this arc-welded situation.

Figure 6:
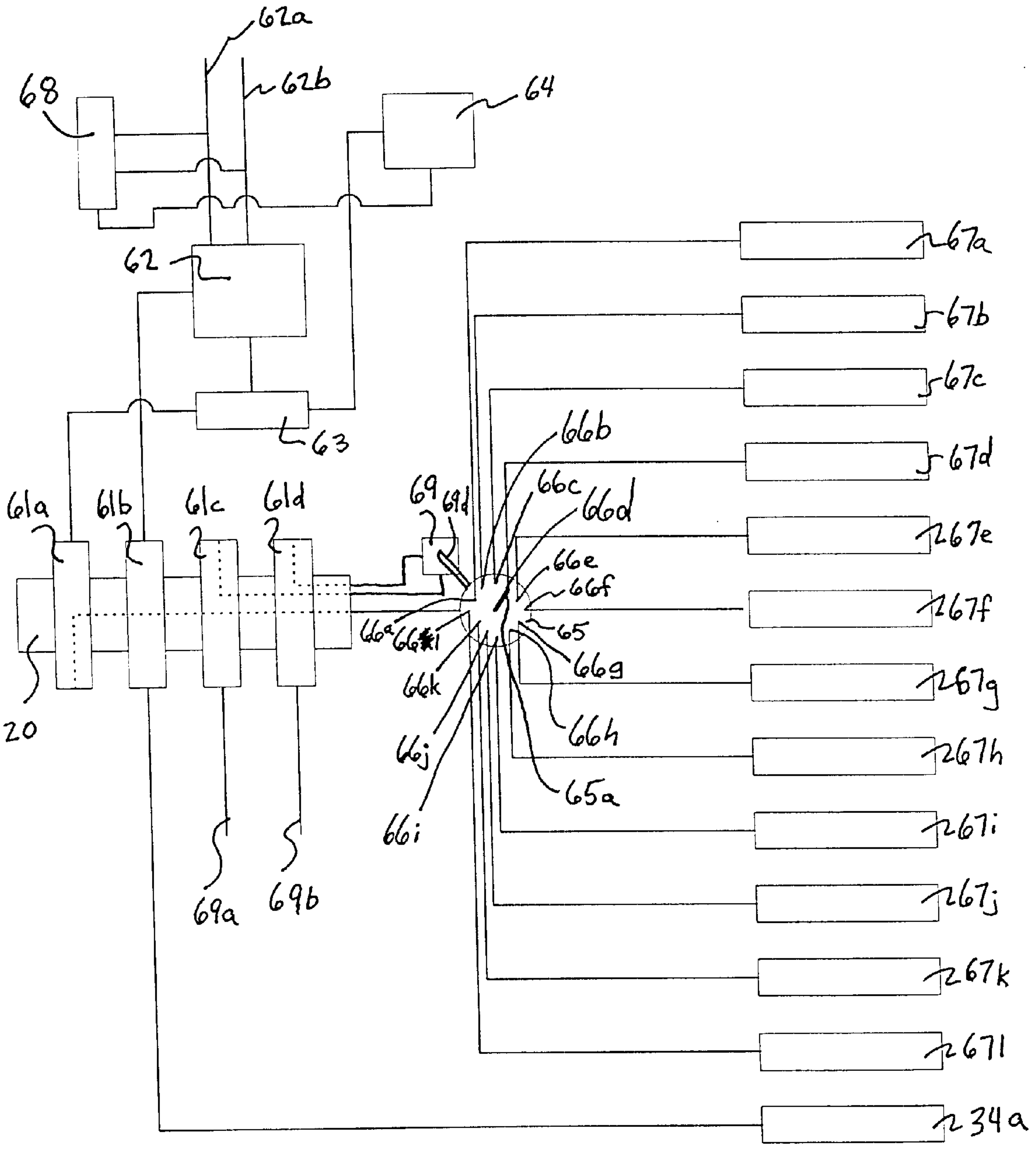
FIG. 6 is a block diagram of a preferred method of forming the detection circuit of the present invention.

Moreover, the present system for conductive contaminants and its method of use may preferably comprise a system that omits the emission source and detection relay system as previously disclosed. As shown in FIG. 6, a block diagram of the preferred embodiment of the system, each positive contact 30 is electrically connected via shaft 20 to positive conductive ring 61*a* and each negative contact 30 is electrically connected to negative conductive ring 61*b*. Negative conductive ring 61*b* is electrically connected to boost transformer 62 such that about 2,400 volts and about two amps are available at all times. This is accomplished by boost transformer 62 receiving an input voltage of about 220 volts at about 42 amps, depicted by input lines 62*a* and 62*b*, such that boost transformer 62 raises the voltage to about 2,400 volts while reducing the amperage to 2 amps. Boost transformer 62 receives its power from typical 220-volt sources of power (not shown) via input lines 62*a* and 62*b* known to those skilled in the art. This combination of voltage and amperage creates the potential of electricity needed for the detection of conductive material in the compost or waste material.

As seen in FIG. 6, the positive terminal of boost transformer 62 is electrically connected to programmable voltage sensor 63. This sensor 63 monitors the amount of voltage leaving conductive ring 61*a*. When the circuit is completed, presumably by a conductive contaminant at contacts 30, the change in electrical charge will be sensed by programmable voltage sensor 63. Sensor 63 will then send a signal to relay 64 that will stop the detection system process as previously described. Conductive ring 61*a* is also electrically connected to spark gap switch 65. Spark gap switch 65 is a switch turned by an electric motor 69. Though many variations will be evident to those skilled in the art, switch 65 may comprise a spark gap switch tip 65*a* that is turned by the motor 69 such that arm 65*a* comes into an electrical contact with a plurality of pins 66*a*–66*l*.

Those skilled in the art will recognize the variations on the number of pins 66*a*–66*l* and the electrical communication with contacts 30 may be varied significantly without exceeding the scope of the present invention. As depicted, FIG. 6 shows 12 pins 66*a*–66*l* arranged in a dodecagon or circular configuration such that the switch 65 may be rotated to cause the spark gap switch tip 65*a* to form a circular path that electrically connects with each pin 66*a*–66*l*, in turn. In this configuration, switch 65 may be rotated at about 360 RPM. This rotation allows for switch 65, namely tip 65*a*, to be in electrical communication with each pin 66*a*–66*l* approximately 3.6 times per second.

In turn, each pin 66*a*–66*l* is electrically connected to a bus bar 67*a*–67*l*. As shown, pin 66*a* is electrically connected to bus bar 67*a*. Accordingly, pin 66*b* is in electrical communication to bus bar 67*b*. Respectively, pins 66*c*–66*l* are similarly connected to bus bars 67*c*–67*l*. When spark gap switch 65 contacts to each pin 66*a*–66*l*, the connection will provide about 2,400 volts at each bus bar 67*a*–67*l* for this brief, but cyclical period of time. As arranged, the rotation of the spark gap switch tip 65*a* insures that each bus bar 67*a*–67*l* receives this available charge about 3.6 times per second.

Moreover, as shown in FIG. 6, a second programmable voltage sensor 68 is in electrical communication with the input lines 62*a* and 62*b* of transformer 62. This voltage sensor 68 functions similarly to programmable sensor 63 such that if a change in electrical charge is sensed in input lines 62*a* and 62*b* due to a conductive contaminant forming a complete circuit in the system, programmable voltage sensor 68 will send a signal to relay 64 that will shut down the system as previously described. Though the redundancy in the programmable voltage sensors 63 and 68 is optional, those skilled in the art will recognize that a second voltage sensor 68 provides an additional level of detection and insurance that conductive contaminants will be properly detected and removed from the unconsolidated material.

As shown, spark gap switch 65 may be rotated by motor 69 either by direct shaft or similar drive mechanism 69*d*. Motor 69 is electrically connected via conductive rings 61*c*and 61*d* to a 110-volt power source known to those skilled in the art (not shown) and is electrically connected via input lines 69*a* and 69*b*. Accordingly, motor 69 is preferably a 110-volt motor capable of consistently rotating spark gap switch 65 at 360 RPM.

Figure 7:
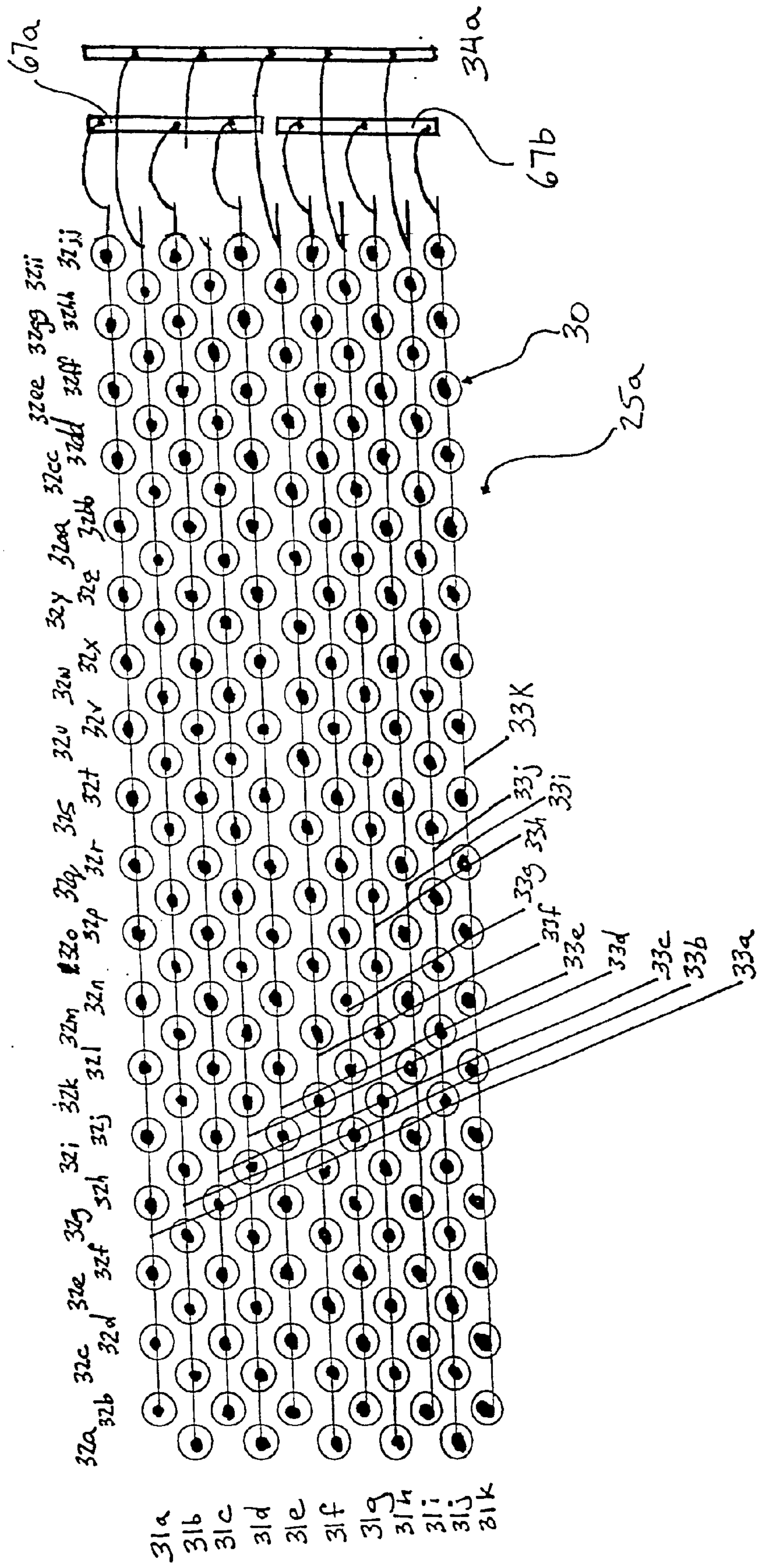
FIG. 7 is a schematic bottom view of the electrical connections of another embodiment of the invention.

FIG. 7 is a schematic bottom view of the electrical connections of a preferred embodiment of the invention. More specifically, FIG. 7 shows a schematic representation of the contacts and bus bar relationships for representative section 25*a*. Those skilled in the art will recognize that significant variations of the contact positioning and electrical wiring as disclosed herein may be implemented. Representative section 25*a* of detection wheel 15 comprises staggered contacts 30 such that alternating rows of contacts 31*a*–31*k* bear a positive, defined as first contacts, and negative charge, defined as second contacts, respectively. By arranging these contacts 31*a*–31*k* in staggered rows, conductive contaminants cannot be positioned such that they will not complete a circuit and signal the sensor system discussed herein. In the preferred embodiment, each section 25*a*–25*f* comprises about 11 rows of contacts 31*a*–31*k* and about 36 columns of contacts 32*a*–32*jj* alternating between first contacts and second contacts, respectively. As before, each contact 30 is about 3 inches (7.62 cm) in length.

Those skilled in the art will realize that the arrangement of wiring may reverse the charge or voltage available at the first contacts to be positive and the charge available at the second contacts to be negative. The invention as described and claimed herein is intended to embody both directions of current. In other words, the contacts as defined as first contacts and second contacts, regardless of the electrical connections thereto, may be rearranged in my manner as long as conductive contaminants will fall within about ¼ inches (0.64 cm) to a first contact and within about ¼ inches (0.64 cm) to a second contact.

As shown, rows 31*b*, 31*d*, 31*f*, 31*h*, and 31*j* of contacts 30 are electrically connected to one another via longitudinally disposed bus bars 33*b*, 33*d*, 33*f*, 33*h*, and 33*j*, respectively, which in turn are connected to bus bar 34*a* as previously described in this invention. Rows 31*a*, 31*c*, 31*e*, 31*g*, 31*i*, and 31*k* of contacts 30 are similarly electrically connected to the other contacts 30 via longitudinally disposed bus bars 33*a*, 33*c*, 33*e*, 33*g*, 33*i*, and 33*k*, respectively. However, bus bars 33*a*, 33*c*, and 33*e* connect to bus bar 67*a*. Similarly, bus bars 33*g*, 33*i*, and 33*k* connect to bus bar 67*b*. When spark gap switch 65, shown in FIG. 6, provides an electrical path via pin 66*a* to bus bar 67*a*, this arrangement will provide an available charge at bus bars 33*a*, 33*c*, and 33*e* and the contacts 30 contained on rows 31*a*, 31*c*, and 31*e*. Subsequently, when spark gap switch 65 provides an electrical path via pin 66*b* to bus bar 67*b*, this arrangement will provide an available charge at bus bars 33*g*, 33*i*, and 33*k* and the contacts 30 contained on rows 31*g*, 31*i*, and 31*k*, respectively. Sections 25*b*–25*f* will have similar configurations, with bus bars 67*c* and 67*d*, bus bars 67*e* and 67*f*, bus bars 67*g* and 67*h*, bus bars 67*i* and 67*j*, and bus bars 67*k* and 67*l* similarly disposed on sections 25*b*–25*f*, respectively. As with section 25*a* shown in FIG. 7, spark gap switch 65 will provide an electrical path via pins 66*c*–66*l* to bus bars 67*c*–66*l* such that an available charge at bars 33*a*, 33*c*, and 33*e* or bus bars 33*g*, 33*i*, and 33*k*, and the contacts 30 contained on rows 31*a*, 31*c*, and 31*e* or on rows 31*g*, 31*i*, and 31*k* of each section 25*b*–f, respectively, will be available. This arrangement will increase efficiency while adopting the other aspects of the invention as previously disclosed.

Though compost materials are envisioned in the preferred method of using the present invention, this system may detect conductive contaminants in any unconsolidated nonconductive material. For example, the present invention may be used in cereals, sugars, or similar foodstuffs or unconsolidated materials to find any conductive contaminant. Additionally, reducing the voltage to prevent false detection due to the conductive nature of unconsolidated materials containing significant amounts of moisture may accommodate unconsolidated materials comprising a moisture-rich content. In those situations, the current transformer must be adjusted such that the sensitivity will accommodate for the lessened voltage as discussed above.

In normal use, less than about four "positive" readings for contaminants for every two hours are expected. In the event that unconsolidated materials contain more conductive contaminants, this frequency will rise and the number of detections will rise accordingly. Moreover, the variable speed of detection wheel 15, the transformers 46*b*–46*d* or 62, the voltage, and the sensitivity of current transformer 45, if present, represent the significant variables in the detection system. In typical usage, approximately 100 to 125 yards of unconsolidated material may be processed using the preferred embodiment of the invention. Though any conductive contaminant should be identifiable, the present system has been tested with contaminants comprising copper, aluminum, steel, stainless steel, and foil paper.

Although the present invention and its advantages have been described in considerable detail, it should be understood that various changes, substitutions, and alterations could be made herein without departing from the spirit and scope of the invention as defined by the appended claims.

What is claimed is:

1. A system for detecting at least one conductive contaminant in unconsolidated materials comprising:

at least one nonconductive section, wherein each section has an exterior surface and an interior surface, wherein a plurality of contacts, identified as first contacts or second contacts, are secured or disposed through the section such that at least 1.5 inches (3.8 cm) of each of the contacts extends above the exterior surface of one of the sections;

an uncompleted electrical circuit comprising:

at least one power source wherein each first contact is electrically connected to one power source; and at least one sensor wherein each second contact is electrically connected to at least one sensor and wherein at least one sensor is electrically connected to each power source; and wherein each contaminant in unconsolidated materials may be disposed within ¼ inch (0.64 cm) of one of the first contacts and within ¼ inch (0.64 cm) of one of the second contacts, thereby completing the circuit and activating at least one sensor.

2. The system of claim 1 further comprising a first conveyor capable of forwarding the materials possibly comprising at least one contaminant onto or near one of the first contacts and onto or near one of the second contacts.

3. The system of claim 2 further comprising at least one hopper capable of guiding the materials such that each contaminant falls onto or near one of the first contacts and onto or near one of the second contacts.

4. The system of claim 1 wherein each power source comprises at least one transformer.

5. The system of claim 1 wherein the sensor comprises an emission source that emits an emission detectable by at least one emission detector that signals at least one relay.

6. The system of claim 1 wherein the sensor comprises at least one current transformer.

7. The system of claim 1 wherein each sensor is electrically connected to at least one relay system that will stop each conveyor.

8. The system of claim 1 further comprising:

a shaft rotatably attached to a frame;

at least one support disk wherein each disk has an outer rim fixedly attached to the shaft wherein each section is fixedly attached or secured to the outer rim of each disk; and at least two conductive rings, a first ring and a second ring, fixedly attached to the shaft wherein the first ring is disposed between and provides the electrical connection between at least some of the first contacts and at least one power source and wherein the second ring is disposed between and provides the electrical connection between at least some of the second contacts and ar least one sensor.

9. The system of claim 1 wherein each first contact is electrically connected to the other first contacts by at least one bus bar disposed on or secured to at least one interior surface of at least one section such that each bar is electrically connected to the first ring via at least one conductive brush.

10. The system of claim 1 further comprising:

a shaft rotatably attached to a frame;

at least two support disks, each having an outer rim fixedly attached to the shaft, wherein a plurality of sections are fixedly attached or secured to the outer rim of each disk to form a detection wheel about the shaft;

at least two conductive rings, a first ring and a second ring, fixedly attached to the shaft wherein the first ring is disposed in between and provides the electrical connection to at least some of the first contacts and at least one power source and the second ring is disposed in between and provides the electrical connection to at least some of the second contacts and at least one sensor; and at least one bus bar connecting each first contact to the other first contacts disposed on the interior surface of each section such that each bar is electrically connected to the first ring via at least one conductive brush.

11. The system of claim 10 further comprising:

at least one conveyor capable of forwarding the materials to the exterior surface of at least one section;

at least one hopper capable of guiding the materials leaving the conveyor such that the materials are guided onto the exterior surface of at least one section; and at least one sensor electrically connected to at least one relay system that will stop each conveyor.

12. The system of claim 11 further comprising a second conveyor disposed below the wheel such that the second conveyor may move reviewed materials from the system.

13. The system of claim 10 comprising an air manifold attached to the frame and positioned such that the manifold may force air at the contacts extending from the exterior surface of a section facing the second conveyor such that material or contaminants disposed within the contacts will be dislodged.

14. The system of claim 10 further comprising a wiper disposed about the second conveyer capable of sweeping the materials and contaminants from the second conveyor.

15. The system of claim 10 wherein the system comprises six sections.

16. A system for detecting conductive contaminants in unconsolidated materials comprising:

at least one nonconductive section, having an exterior surface and an interior surface, wherein a plurality of contacts, identified as first or second contacts, are secured or disposed through the section such that at least 1.5 inches (3.8 cm) of each contact extends above the exterior surface;

an uncompleted electrical circuit comprising:

at least one power source electrically connected to the first contacts;

at least one voltage sensor electrically connected to each power source and to the second contacts;

at least one conveyor capable of forwarding the materials to the exterior surface;

at least one hopper capable of guiding the materials leaving the conveyor such that the materials are guided onto the exterior surface;

at least one relay system electrically connected to each sensor that will stop each conveyor;

a shaft rotatably attached to a frame;

at least two support disks, each having an outer rim fixedly attached to the shaft, wherein a plurality of setions are fixedly attached or secured to the outer rim of each disk to form a detection wheel about the shaft; and at least two conductive rings, a first ring and a second ring, fixedly attached to the shaft wherein the first ring is disposed in between and provides the electrical connection between at least some of the first contacts and at least one power source and the second ring is disposed in between and provides the electrical connection between at least some of the second contacts and at least one sensor;

wherein a conductive contaminant in unconsolidated materials will complete the electrical circuit and activate at least one voltage sensor.

17. The system of claim 16 further comprising a second conveyor disposed below the wheel such that the second conveyor may move reviewed materials from the system;

an air manifold attached to the frame and positioned such that the manifold may force air at the contacts extending from the exterior surface of a section facing the second conveyor such that material or contaminants disposed within the contacts will be dislodged; and a wiper disposed about the second conveyer capable of sweeping the materials and contaminants from the second conveyor.

18. The system of claim 16 further comprising a rotating spark gap switch that periodically connects each first contact and each power source wherein the switch provides a potential voltage to selected rows of the first contacts such that all first contacts are provided with the potential voltage at cyclical intervals such that the conductive contaminant disposed within the material will complete the electrical circuit while disposed on the detection wheel.

19. The system of claim 18 wherein the switch is rotated by a motor at about 360 rotations per minute such that each first contact receives the potential voltage about 3.6 times per second.

20. The system of claim 16 wherein at least one voltage sensor is electrically connected to an input terminal of at least one transformer.

21. A method of detecting conductive contaminants in unconsolidated materials comprising:

allowing the materials to pour into a hopper that guides the materials onto a rotating detection wheel wherein the wheel comprises:

a plurality of nonconductive sections, having exterior surfaces and interior surfaces, wherein a plurality of contacts, identified as first or second contacts, are secured or disposed through each section such that a distance of no more than ¾ inches (1.9 cm) exists between each first contact and a second contact and at least 1 inch (2.54 cm) of each contact extends above the exterior surface of one of the sections;

an uncompleted electrical circuit comprising:

at least one power source electrically connected to the first contacts;

at least one sensor electrically connected to each power source and to the second contacts; and a shaft rotably attached to a frame;

at least two support disks, each having an outer rim fixedly attached to the shaft, wherein each section is fixedly attached or secured to the outer rim of each disk to form the wheel about the shaft;

at least two conductive rings, a first ring and a second ring, fixedly attached to the shaft wherein the first ring is disposed in between and provides the electrical connection between at least some of the first contacts and at least one power source and the second ring is disposed in between and provides the electrical connection between at least some of the second contacts and at least one sensor;

wherein a conductive contaminant in unconsolidated materials will complete the electrical circuit activating at least one sensor;

stopping the first conveyor and a second conveyor disposed below the wheel;

wiping the materials from the second conveyor after a delay sufficient to allow the rotating wheel to dump the materials containing the conductive contaminant onto the second conveyor; and reactivating both the first and second conveyors to process additional materials.

22. The method of claim 21 further comprising dislodging any materials or conductive contaminants disposed within that fail to drop onto the second conveyor by blowing air at the contacts extending from the exterior surface of a section facing the second conveyor such that material or contaminants disposed within the contacts fall onto the second conveyor.

23. The method of claim 22 further comprising packaging the reviewed unconsolidated material.

24. The method of claim 22 further comprising storing the reviewed unconsolidated material.

* * * * *

UNITED STATES PATENT AND TRADEMARK OFFICE

CERTIFICATE OF CORRECTION

PATENT NO. : 6,469,526 B1 
DATED : October 22, 2002
INVENTOR(S) : Franklin

It is certified that error appears in the above-identified patent and that said Letters Patent is hereby corrected as shown below:

Column 2,
Line 56, following "FIG. 1" and before "an" please insert -- is --.
Line 58, following "close" and before "schematic" please insert -- up --.
Line 66, following "FIG. 4" and before "block" please insert -- is --.

Column 10,
Line 67, please delete "ar" and insert therefor -- at --.

Column 12,
Line 4, please delete "setions" and insert therefor -- sections --.

Signed and Sealed this

Eighteenth Day of March, 2003

JAMES E. ROGAN
*Director of the United States Patent and Trademark Office*